(12) United States Patent
Uematsu et al.

(10) Patent No.: US 7,347,951 B2
(45) Date of Patent: Mar. 25, 2008

(54) METHOD OF MANUFACTURING ELECTRONIC DEVICE

(75) Inventors: Ikuo Uematsu, Yokohama (JP); Naoya Hayamizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 379 days.

(21) Appl. No.: 11/206,036

(22) Filed: Aug. 18, 2005

(65) Prior Publication Data

US 2005/0277291 A1 Dec. 15, 2005

Related U.S. Application Data

(62) Division of application No. 10/389,981, filed on Mar. 18, 2003, now Pat. No. 7,018,552.

(30) Foreign Application Priority Data

Mar. 26, 2002 (JP) ............................... 2002-087050

(51) Int. Cl.
*C23G 1/06* (2006.01)
(52) U.S. Cl. .......................... 216/18; 216/39; 216/57; 216/67; 216/109; 134/3; 438/963; 252/79.3; 252/79.4
(58) Field of Classification Search ............... None
See application file for complete search history.

(56) References Cited

U.S. PATENT DOCUMENTS 4,851,148 A 7/1989 Yamasoe et al.
4,857,225 A 8/1989 Terada et al.
5,254,156 A 10/1993 Nakaso et al.
2002/0001887 A1 1/2002 Sung et al.

FOREIGN PATENT DOCUMENTS

| JP | 6-349791 | 12/1994 |
|---|---|---|
| JP | 11-243085 | 9/1999 |
| JP | 2000-82739 | 3/2000 |
| JP | 2000-277522 | 10/2000 |
| JP | 2001-247986 | 9/2001 |
| JP | 2001-308054 | 11/2001 |

*Primary Examiner*—Allan Olsen
(74) *Attorney, Agent, or Firm*—Oblon, Spivak, McClelland, Maier & Neustadt, P.C.

(57) ABSTRACT

A method of manufacturing an electronic device comprises forming a wiring material layer made of aluminum or an aluminum alloy on the surface of an insulating film on a substrate, patterning the wiring material layer by a reactive ion etching treatment with a resist pattern used as a mask so as to form a wiring, and treating the surface of the insulating film including the wiring with an aqueous solution for removing the etching residue, the aqueous solution containing a peroxosulfate, a fluorine-containing compound and an acid for adjusting the pH value and having a pH value of −1 to 3.

6 Claims, 8 Drawing Sheets

METHOD OF MANUFACTURING ELECTRONIC DEVICE

CROSS-REFERENCE TO RELATED APPLICATIONS

This application is based upon and claims the benefit of priority from the prior Japanese Patent Application No. 2002-87050, filed Mar. 26, 2002, the entire contents of which are incorporated herein by reference.

BACKGROUND OF THE INVENTION

1. Field of the Invention

The present invention relates to a method of manufacturing an electronic device, particularly, to a method of manufacturing an electronic device in which the process step after the reactive ion etching (RIE) treatment is improved in the manufacture of a semiconductor device or a liquid crystal display device.

2. Description of the Related Art

In, for example, a semiconductor device, aluminum or copper is used for forming the metal wiring. A so-called "electromigration", in which migration of aluminum atoms is brought about by the current applied to a device, is generated in the aluminum wiring. An aluminum alloy containing a small amount of copper is used for forming a wiring effective for preventing the electromigration.

Also, an aluminum alloy prepared by adding a small amount of silicon or titanium to aluminum is used for forming the wiring in order to minimize the generation of an electric spike in the contact hole.

The metal wiring included in the semiconductor device is formed by the various processes given below:

1) In the first step, a metal layer containing aluminum is formed on an insulating film on a semiconductor substrate. Then, the metal film is covered with a resist film, followed by subjecting the resist film to a so-called "photographic etching", in which the resist film is subjected to the exposure to light and the developing treatment, so as to form a resist pattern. Further, the exposed portion of the metal layer is selectively removed by a reactive ion etching (RIE) treatment with the resist pattern used as a mask so as to form a wiring containing aluminum. Finally, the residual resist pattern is peeled off and removed.

After formation of the metal wiring by the selective etching of the metal layer containing aluminum and formed by method 1) given above by means of a RIE treatment using a resist pattern, a residue derived from the metal and the resist such as a polymer and a denatured layer is attached to the surface and the side wall of the metal wiring. The particular residue lowers the reliability of the semiconductor device. Such being the situation, it was customary in the past to treat the formed metal wiring with an alkali aqueous solution such as an aqueous solution of hydroxylamine so as to remove the residue.

However, since the wiring contains an amphoteric aluminum, the wiring is etched within an alkali aqueous solution such as an aqueous solution of hydroxylamine so as to be thinned, with the result that the resistance value of the wiring is increased.

2) In the first step, a metal layer containing aluminum is formed on a first layer insulating film on a semiconductor substrate, followed by covering the metal layer with a resist film and subsequently subjecting the resist film to a photographic etching so as to form a resist pattern. Then, the exposed portion of the metal layer is selectively removed by a RIE treatment with the resist pattern used as a mask so as to form a first layer wiring. After formation of the first layer wiring, the resist pattern is peeled off and removed, followed by forming a second layer insulating film on the first layer insulating film including the first layer wiring. Then, a resist film is formed on the second layer insulating film, followed by applying a photographic etching to the resist film so as to form a resist pattern having openings formed in the portions where via holes are to be formed. Further, the exposed portions of the second layer insulating film are selectively removed by a RIE treatment with the resist pattern used as a mask so as to form via holes. Still further, a conductive barrier film and a metal film such as a tungsten film are deposited on the second layer insulating film including the via holes so as to form a conductive barrier film on at least the inner surface of the via hole. At the same time, the via hole having the conductive barrier film formed on the inner surface is filled with the metal film. Then, a chemical mechanical polishing (CMP) treatment is applied to the metal film and the conductive barrier film so as to form a via fill connected to the first layer wiring in the second layer insulating film.

In the next step, a metal layer is formed to cover the second insulating film including the via fill, followed by covering the metal layer with a resist film. The resist film thus formed is subjected to a photographic etching so as to form a resist pattern. Then, the exposed portion of the metal layer is selectively removed by a reactive ion etching (RIE) treatment with the resist pattern used as a mask so AS to form a second layer wiring.

After formation of the via hole by selectively etching the second layer insulating film formed by method 2) described above by means of the RIE treatment using the resist pattern, a residue such as a polymer derived from the resist and the denatured layer derived from the resist and the material of the insulating film is attached to the inner surface of the via hole. If a conductive barrier film is formed on the inner surface of the via hole with the residue left unremoved, the conductive barrier film is peeled off in the subsequent step of burying a metal film in the via hole, with the result that the barrier function is impaired. Such being the situation, it was customary in the past to treat the inner surface of the via hole with an alkali aqueous solution such as an aqueous solution of hydroxylamine so as to remove the residue.

However, the first layer wiring exposed to the outside from the bottom portion of the via hole contains an amphoteric aluminum and, thus, is etched within an alkaline aqueous solution such as an aqueous solution of hydroxylamine. As a result, the thickness of, for example, the first layer wiring is decreased so as to increase the resistance value of the first layer wiring. In an extreme case, a serious problem is generated such that the first layer wiring is caused to disappear or is broken.

Also, after formation of the second layer wiring by selectively etching the second metal layer formed by method 2) described above by means of a RIE treatment using a resist pattern, a residue such as a polymer or a denatured layer derived from the metal and the resist is attached to the surface and the side wall of the second layer wiring. What should be noted is that the particular residue lowers the reliability of the semiconductor device. Such being the situation, it was customary in the past to treat the surface of the second layer wiring with an alkali aqueous solution such as an aqueous solution of hydroxylamine after formation of the second layer wiring so as to remove the residue.

However, if the width of the second layer wiring is made smaller with progress in the degree of integration of the semiconductor device, the via fill is not covered with the second layer wiring in the contact portion with the second layer wiring so as to be exposed to the outside. Therefore, where the via fill is formed of a material containing tungsten as a main component, a serious problem is generated that, when the second layer wiring is treated with an alkali aqueous solution such as an aqueous solution of hydroxylamine, the alkali aqueous solution is also brought into contact with the via fill formed of a material containing tungsten (W) as a main component. The dissolution of tungsten is derived from a large difference in the ionization tendency (potential difference) between the second layer wiring, e.g., Al, and tungsten in the presence of the alkali aqueous solution in mainly the contact portion noted above.

Jpn. Pat. KOKAI Publication No. 2001-247986 discloses a composition for removing smut comprising an oxidizing agent such as ammonium peroxodisulfate, an acid such as sulfuric acid or phosphoric acid, and a halide ion-containing compound such as hydrofluoric acid. It is taught that a part or an article made of aluminum or an aluminum alloy is treated with the particular composition before application of an electroplating treatment to the part or the article made of aluminum or an aluminum alloy so as to remove the metal and the oxide (smut) inhibiting the electroplating process from the particular part or the article.

An object of the present invention is to provide a method of manufacturing an electronic device, which involves formation of a wiring made of aluminum or an aluminum alloy by a reactive ion etching (RIE) treatment and which permits removing the metal residue attached to the surface and the side wall of the wiring and the polymer and the denatured layer derived from the resist in the treatment after formation of the wiring without bringing about, for example, the thinning of the wiring by the etching.

Another object of the present invention is to provide a method of manufacturing an electronic device, which involves formation of a via hole for a via fill in an insulating film for an electrical connection to the underlying wiring made of aluminum or an aluminum alloy by a RIE treatment and which permits removing the polymer and the denatured layer derived from the resist attached to the inner surface of the via hole in the treatment after formation of the via hole in the insulating film without bringing about, for example, the thinning of the underlying wiring by the etching.

Further, still another object of the present invention is to provide a method of manufacturing an electronic device, which involves formation of a fine wiring by a RIE treatment in an insulating film having a tungsten-based via fill formed therein such that the fine wiring is exposed to the outside in the contact portion with the via fill and which permits removing the metal residue attached to the surface and the side wall of the wiring and the polymer and the denatured layer derived from the resist in the treatment after formation of the fine wiring without bringing about the dissolution of tungsten contained in the exposed portion of the via fill.

BRIEF SUMMARY OF THE INVENTION

According to a first aspect of the present invention, there is provided a method of manufacturing an electronic device, comprising:

forming a wiring material layer made of aluminum or an aluminum alloy on the surface of an insulating film on a substrate;

patterning the wiring material layer by a reactive ion etching treatment with a resist pattern used as a mask so as to form a wiring; and treating the surface of the insulating film including the wiring with an aqueous solution for removing the etching residue, the aqueous solution containing a peroxosulfate, a fluorine-containing compound and an acid for adjusting the pH value and having a pH value of −1 to 3.

According to a second aspect of the present invention, there is provided a method of manufacturing an electronic device, comprising:

forming a first layer wiring made of aluminum or an aluminum alloy on the surface of a first layer insulating film on a substrate;

forming a second layer insulating film on the first layer insulating film including the first layer wiring;

subjecting the second layer insulating film to a reactive ion etching with a resist pattern used as a mask so as to form a via hole extending to reach the surface of the first layer wiring;

treating the surface of the second layer insulating film including the via hole with an aqueous solution for removing the etching residue, the aqueous solution containing a peroxosulfate, a fluorine-containing compound and an acid for adjusting the pH value and having a pH value of −1 to 3;

forming a conductive barrier layer on at least the inner surface of the via hole;

forming a conductive material film on the surface of the second layer insulating film including the inner region of the via hole having the barrier layer formed on the inner surface; and removing the conductive material film and the conductive barrier layer by a chemical mechanical polishing so as to form a via fill.

Further, according to a third aspect of the present invention, there is provided a method of manufacturing an electronic device, comprising:

forming a tungsten-based via fill in an insulating film on a substrate;

forming a wiring material layer on the insulating film including the via fill;

patterning the wiring material layer by a reactive ion etching with a resist pattern used as a mask so as to form a wiring having a smaller width in the contact portion with the via fill; and treating the surface of the insulating film including the wiring with an aqueous solution for removing the etching residue, the aqueous solution containing a peroxosulfate, a fluorine-containing compound and an acid for adjusting the pH value and having a pH value of −1 to 3.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention, and together with the general description given above and the detailed description of the preferred embodiments given below, serve to explain the principles of the present invention.

DETAILED DESCRIPTION OF THE INVENTION

Figure 1A:
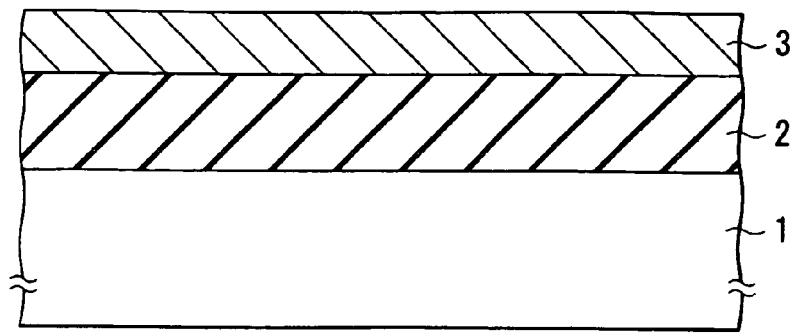
FIGS. 1A to 1C are cross sectional views collectively showing a process of manufacturing a semiconductor device in Example 1 of the present invention.

The present invention will now be described in detail.

First Embodiment (First Step)

A wiring material layer made of aluminum or an aluminum alloy is formed on an insulating film on a substrate.

It is possible for the substrate to be a semiconductor substrate such as a silicon substrate in the case where the electronic device to be manufactured is a semiconductor device or to be a glass substrate in the case where the electronic device to be manufactured is a liquid crystal display device.

It is possible for the insulating film to be, for example, a silicon oxide film, a boron-added glass film (BPSG film), or a phosphorus-added glass film (PSG film). It is also possible for the insulating film to be formed of an insulating material having a relative dielectric constant not larger than 3.5 such as SiOF, an organic spin on glass, polyimide, a fluorine-added polyimide, polytetrafluoroethylene, a fluorinated polyaryl ether or a fluorine-added palerin.

Further, it is possible to use, for example, an Al—Si alloy, an Al—Cu alloy, or an Al—Cu—Si alloy as the aluminum alloy.

(Second Step)

A resist film is formed to cover the wiring material layer, followed by subjecting the resist film to a so-called "photographic etching", in which the resist film is subjected to exposure to light and a developing treatment, so as to form a resist pattern. Then, the exposed portion of the wiring material layer is selectively removed by a reactive ion etching (RIE) treatment using a chlorine-based reactant gas or a fluorine-based reactant gas with the resist pattern used as a mask so as to form a wiring made of aluminum or an aluminum alloy. Further, the residual resist pattern is removed by peeling by, for example, an ashing treatment.

(Third Step)

The surface of the insulating film including the wiring is treated with an aqueous solution for removing the etching residue containing a peroxosulfate, a fluorine-containing compound and an acid for adjusting the pH value and having a pH value of −1 to 3.

The details of the components of the aqueous solution for removing the etching residue are as follows:

1) Peroxosulfate

The peroxosulfate used in the present invention includes a peroxomonosulfate and a peroxodisulfate. Also, the peroxodisulfate includes, for example, ammonium peroxodisulfate.

The peroxosulfate serves to remove by decomposition the organic material such as a polymer and a denatured layer derived from the resist, which is an etching residue, and to protect the wiring made of aluminum or an aluminum alloy from the etching with a fluorine-containing compound.

In the case of using ammonium peroxodisulfate as the peroxosulfate, it is desirable for the ammonium peroxodisulfate to be contained in the aqueous solution for removing the etching residue in an amount of 0.01 mol/L to 20 mols/L.

If the amount the ammonium peroxodisulfate is smaller than 0.01 mol/L, it is difficult to remove by decomposition the organic substance and to obtain the function of protecting the etching of the wiring. On the other hand, if the amount the ammonium peroxodisulfate exceeds 20 mols/L, the oxidation of the surface of the wiring tends to proceed excessively so as to impair the conductivity of the wiring surface. It is more desirable for the ammonium peroxodisulfate content in the aqueous solution to fall within a range of between 0.1 mol/L and 0.5 mol/L.

2) Fluorine-Containing Compound

The fluorine-containing compound used in the present invention includes, for example, hydrofluoric acid and ammonium acid fluoride. The fluorine-containing compound serves to remove the metal and oxide constituting the etching residue.

The function of removing the metal and oxide will now be described with hydrofluoric acid taken as an example.

Hydrofluoric acid is dissociated in the presence of water as denoted by formulas (1) and (2) given below. The dissociating reaction is an equilibrium reaction:

$$HF \Leftrightarrow H^+ + F^- \tag{1}$$

$$F^- + HF \Leftrightarrow HF_2^- \tag{2}$$

HF before the dissociation represented in formula (1) is weak in its etching function exerted on the metal and the oxide. However, $HF_2^-$ represented in formula (2) produces a strong etching function on the metal and the oxide. Therefore, if a large amount of $HF_2^-$ is present in the aqueous solution for removing the etching residue, the insulating film such as a $SiO_2$ film is etched. In addition, the function of protecting the wiring made of aluminum or an aluminum alloy from the etching with a fluorine-containing compound, which is produced by the peroxosulfate, is lowered. Such being the situation, formation of $HF_2^-$ in the aqueous solution for removing the etching residue is suppressed by adjusting the pH value with an acid for adjusting the pH value.

It is desirable for the fluorine-containing compound to be contained in the aqueous solution for removing the etching residue in an amount of $5 \times 10^{-6}$ mol/L to $5 \times 10^{-1}$ mol/L. If the amount of the fluorine-containing compound is smaller than $5 \times 10^{-6}$ mol/L, it is difficult to remove the metal and the oxide constituting the etching residue. On the other hand, if the amount of the fluorine-containing compound exceeds $5 \times 10^{-1}$ mol/L, $HF_2^-$ is formed in a large amount in the aqueous solution for removing the etching residue, the insulating film tends to be removed by etching and the wiring also tends to be etched so as to be thinned. It is more desirable for the fluorine-containing compound to be contained in the aqueous solution for removing the etching residue in an amount of $1 \times 10^{-4}$ mol/L to $1 \times 10^{-2}$ mol/L.

3) Acid for Adjusting the pH Value

It is possible to use an inorganic acid such as sulfuric acid, nitric acid, hydrochloric acid or phosphoric acid or an organic acid such as acetic acid or oxalic acid as the acid for adjusting the pH value. Particularly, it is desirable to use sulfuric acid for adjusting the pH value.

The pH value of the aqueous solution for removing the etching residue is adjusted to −1 to 3 by the acid for adjusting the pH value to make the aqueous solution strongly acidic. Therefore, the concentration of the hydrogen ions ($H^+$) in the aqueous solution is increased so as to shift the equilibrium reaction of HF given by formula (1) to the left, i.e., the equilibrium reaction is shifted to increase HF. In other words, the shifting of the equilibrium reaction given by formula (2) to the right is suppressed so as to decrease the amount of $HF_2^-$ formed in the aqueous solution to an appropriate level.

It is more desirable for the pH value of the aqueous solution for removing the etching residue to fall within a range of between 0 and 1. It is also desirable for the aqueous solution for removing the etching residue to be used at the liquid temperature of 20 to 35° C.

The aqueous solution for removing the etching residue having the composition given above serves to decrease the difference in the ionization tendency (potential difference) between aluminum (Al) and any of tungsten (W), titanium (Ti) and titanium nitride (TiN).

Incidentally, in the manufacture of an electronic device according to the first embodiment of the present invention, it is possible to apply a rinsing treatment with a water-soluble organic solvent or with a pure water after the treatment with the aqueous solution.

As described above, according to the first embodiment of the present invention, a wiring material layer made of aluminum or an aluminum alloy is formed on the surface of an insulating film on a substrate, followed by patterning the wiring material layer by means of a reactive ion etching (RIE) using a resist pattern so as to form a wiring. Further, the wiring thus formed is treated with an aqueous solution for removing the etching residue, the aqueous solution containing a peroxosulfate, a fluorine-containing compound and an acid for adjusting a pH value and having a pH value of −1 to 3. By the particular treatment, it is possible to remove the metal attached to the surface and the side wall of the wiring made of aluminum or an aluminum alloy during the RIE treatment as well as the residue such as the polymer and the denatured layer derived from the resist without bringing about, for example, the thinning of the wiring caused by the etching. To be more specific, the polymer and the denatured layer derived from the resist can be removed by the oxidizing function performed by the peroxosulfate during the treatment with the aqueous solution for removing the etching residue.

The metal, which is the residue attached to the surface and the side wall of the wiring, can also be removed by the fluorine-containing compound, e.g., hydrofluoric acid, contained in the aqueous solution. In this case, the formation of $HF_2^-$ producing a strong etching force from the fluorine-containing compound, e.g., hydrofluoric acid, contained in the aqueous solution can be suppressed by adjusting the pH value of the aqueous solution to −1 to 3 by the function of the acid for adjusting the pH value so as to make appropriate the amount of $HF_2^-$. It follows that it is possible to remove efficiently the metal residue while suppressing the etching of the insulating film made of, for example, an oxide by the function of HF producing a weak etching force and an appropriate amount of $HF_2^-$.

During the treatment with the aqueous solution for removing the etching residue, the wiring made of aluminum or an aluminum alloy is also exposed to the aqueous solution, with the result that the wiring is also subjected to the etching function produced by the fluorine-containing compound, e.g., hydrofluoric acid, contained in the aqueous solution. In this case, the surface of the wiring is protected from the hydrofluoric acid by the oxidizing function produced from the peroxosulfate. At the same time, it is also possible to overcome the inconvenience such as the etching of the wiring, which causes the thinning of the wiring, by suppressing the formation of $HF_2^-$ producing a strong etching force so as to make appropriate the amount of $HF_2^-$, as described previously.

Incidentally, the wiring made of aluminum or an aluminum alloy, which has received the oxidizing function produced by the peroxosulfate, exhibits a sufficiently high electrical conductivity on the surface, etc.

As described above, according to the first embodiment of the present invention, the treatment with an aqueous solution of the composition described previously for removing the etching residue is applied after formation of the wiring. As a result, it is possible to remove the metal attached to the surface and the side wall of the wiring made of aluminum or an aluminum alloy during the RIE treatment as well as the residue such as the polymer and the denatured layer derived from the resist without bringing about, for example, the thinning of the wiring caused by the etching.

Particularly, the residue attached to the surface and the side wall of the wiring can be removed with a higher certainty without etching the wiring in the case of performing the treatment with an aqueous solution for removing the etching residue containing 0.01 mol/L to 20 mols/L of ammonium peroxodisulfate, $5 \times 10^{-6}$ mol/L to $5 \times 10^{-1}$ mol/L of a fluorine-containing compound and an acid for adjusting the pH value and having a pH value of −1 to 3.

As a result, it is possible to manufacture an electronic device having the wiring maintained at the designed resistance value and exhibiting an improved reliability.

It should also be noted that the aqueous solution for removing the etching residue can be washed away from the surface of the insulating film without etching the wiring by applying a rinsing treatment with a water-soluble organic solvent or with a pure water after the treatment with the aqueous solution for removing the etching residue.

To be more specific, if a rinsing treatment with a pure water is applied after the treatment of the wiring made of aluminum or an aluminum alloy with the conventional alkaline aqueous solution such as an aqueous solution of hydroxylamine, the etching of the wiring proceeds rapidly in the process of the dilution. of the alkaline aqueous solution with a pure water. On the other hand, the aqueous solution for removing the etching residue, which is used in the present invention, permits preventing the etching of the wiring in the diluting process during the rinsing treatment.

Second Embodiment (First Step)

A wiring material layer made of aluminum or an aluminum alloy is formed on the surface of a first layer insulating film on the substrate. Then, a resist film is formed to cover the wiring material layer, followed by subjecting the resist film to a photographic etching so as to form a resist pattern. Further, the exposed portion of the wiring material layer is selectively removed by etching with the resist pattern used as a mask so as to form a first layer wiring.

It is possible to use the substrate, the insulating film and the aluminum alloy described previously in conjunction with the first embodiment of the present invention.

(Second Step)

After removal by peeling of the resist pattern by, for example, an ashing treatment, a second layer insulating film is formed on the first layer insulating film including the first layer wiring. Then, a resist film is formed to cover the second layer insulating film, followed by applying a photographic etching to the resist film so as to form a resist pattern having openings formed in the portions where via holes are to be formed. Further, the exposed portion of the second layer insulating film is selectively removed by a reactive ion etching (RIE) treatment with the resist pattern used as a mask so as to form via hole. The via hole extends to reach the surface of the first layer wiring.

It is possible to use the insulating film equal to that described previously in conjunction with the first embodiment of the present invention.

(Third Step)

The surface of the second layer insulating film including the via hole is treated with an aqueous solution for removing the etching residue containing a peroxosulfate, a fluorine-containing compound and an acid for adjusting the pH and having a pH value of −1 to 3.

The components of the aqueous solution for removing the etching residue and the functions produced by these components are equal to those described previously in conjunction with the first embodiment of the present invention.

(Fourth Step)

A conductive barrier film and a metal film are deposited on the second layer insulating film including the via hole so as to form a conductive barrier film on at least the inner surface of the via hole. At the same time, the metal film is buried in the via hole having the conductive barrier film formed on the inner surface thereof. Then, a chemical mechanical polishing (CMP) treatment is applied to the metal film and the conductive barrier film so as to form a via fill connected to the first layer wiring in the second layer insulating film.

The barrier conductive film is formed of at least one kind of the conductive material selected from the group consisting of Ta, TaN, Ti and TiN. The barrier metal film can be used in the form of a single layer film or a laminated film comprising a plurality of layers.

The metal film used in the present invention includes, for example, a tungsten film, a Cu film and a Cu alloy film such as a Cu—Si alloy film, a Cu—Al alloy film, a Cu—Si—Al alloy film or a Cu—Ag alloy film.

Incidentally, in the manufacture of an electronic device according to the second embodiment of the present invention described above, it is possible to apply a rinsing treatment with a water-soluble organic solvent such as alcohol or with a pure water after the treatment with the aqueous solution for removing the etching residue.

As described above, according to the second embodiment of the present invention, a first layer wiring made of aluminum or an aluminum alloy is formed on the surface of a first layer insulating film on a substrate, followed by forming a second layer insulating film on the first layer insulating film including the first layer wiring. Then, a reactive ion etching is applied to the second layer insulating film with a resist pattern used as a mask so as to form in the second layer insulating film a via hole extending to reach the surface of the first layer wiring, followed by treatment with an aqueous solution for removing the etching residue containing a peroxosulfate, a fluorine-containing compound, and an acid for adjusting the pH value and having a pH value of −1 to 3. By this treatment, the residue including the polymer derived from the resist attached to the inner surface of the via hole during the etching treatment and the denatured layer derived from the resist and the material of the insulating film can be removed without decreasing the thickness of the first layer wiring exposed to the outside from the bottom portion of the via hole and made of aluminum or an aluminum alloy.

To be more specific, the residue including the polymer derived from the resist attached to the inner surface of the via hole and the denatured layer derived from the resist and the material of the insulating film can be removed by the oxidizing function of the peroxosulfate and the fluorine-containing compound, e.g., hydrofluoric acid, during the treatment with the aqueous solution for removing the etching residue. In this case, it is possible to suppress the formation of $HF_2^-$ producing a strong etching force from the fluorine-containing compound, e.g., hydrofluoric acid, contained in the aqueous solution by adjusting the pH value of the aqueous solution to −1 to 3 by the function of the acid for adjusting the pH value so as to make appropriate the amount of $HF_2^-$. It follows that it is possible to remove efficiently the residue attached to the fine via hole while suppressing the etching of the second layer insulating film made of, for example, an oxide by the function of HF producing a weak etching force and the appropriate amount of $HF_2^-$.

It should be noted that, during the treatment with the aqueous solution for removing etching residue, the first layer wiring itself exposed to the outside through the via hole and made of aluminum or an aluminum alloy is also exposed to the aqueous solution so as to receive an etching function produced by the fluorine-containing compound, e.g., hydrofluoric acid, contained in the aqueous solution. In this case, the surface of the first layer wiring is protected from the hydrofluoric acid by the oxidizing function produced by the peroxosulfate. Also, the formation of $HF_2^-$ exhibiting a strong etching force is suppressed so as to make appropriate the amount of $HF_2^-$. It follows that it is possible to overcome the inconvenience that the thickness of the first layer wiring is decreased by the etching.

As described above, according to the second embodiment of the present invention, the treatment with an aqueous solution having the composition described above is carried out for removing the etching residue after formation of the via hole. As a result, the residue attached to the inner surface of the via hole during the RIE treatment can be removed without inviting the decrease by the etching in the thickness of the first layer wiring exposed to the outside from the bottom portion of the via hole and made of aluminum or an aluminum alloy.

Particularly, the residue attached to the inner surface of the via hole can be removed with a higher certainty without etching the first layer wiring exposed to the outside from the via hole by the treatment with an aqueous solution for removing the etching residue containing 0.01 mol/L to 20 mols/L of ammonium peroxodisulfate, $5 \times 10^{-6}$ mol/L to $5 \times 10^{-1}$ mol/L of a fluorine-containing compound, and an acid for adjusting the pH value and having a pH value of −1 to 3.

When a conductive barrier film is deposited on the second layer insulating film including the via hole having a cleansed inner surface and a metal film is buried in the via hole, the conductive barrier film is prevented from being peeled off. As a result, it is possible to manufacture an electronic device, in which a via fill having a high reliability and connected to the first layer wiring is formed in the second layer insulating film, by applying a chemical mechanical polishing (CMP) treatment to the metal film and the conductive barrier film.

It should also be noted that the first layer wiring made of aluminum or an aluminum alloy and subjected to the oxidizing function produced by the peroxosulfate exhibits a sufficiently high electrical conductivity so as to make to possible to achieve a sufficient ohmic contact between the first layer wiring and the via fill after formation of the via fill.

Further, it is possible to apply a rinsing treatment with a water-soluble organic solvent such as alcohol or with a pure water after the treatment with the aqueous solution for removing the etching residue. In this case, the first layer wiring exposed from the via hole is not etched in the diluting process of the aqueous solution, and the aqueous solution for removing the etching residue can be washed away from the surface of the second layer insulating film.

Third Embodiment (First Step)

A resist film is formed to cover an insulating film on a substrate, followed by subjecting the resist film to a photographic etching so as to form a resist pattern having openings formed in the portions where via holes are to be formed. Then, the exposed portion of the insulating film is selectively removed by the etching with the resist film used as a mask so as to form via holes. Further, a conductive barrier film and a tungsten film are deposited on the insulating film including the via hole so as to form a conductive barrier film on at least the inner surface of the via hole, and the tungsten film is buried in the via hole having the conductive barrier film formed on the inner surface. Still further, a chemical mechanical polishing (CMP) treatment is applied to the tungsten film and the conductive-barrier film so as to form a via fill on the insulating film.

It is possible to use the substrate and the insulating film similar to those described previously in conjunction with the first embodiment of the present invention. It is also possible to use the conductive barrier film similar to that described previously in conjunction with the second embodiment of the present invention.

Further, the via fill can be formed in those portions of the insulating film which correspond to the diffusion layers such as the source region and the drain region formed in the semiconductor substrate, in the insulating film positioned between the first layer wiring and the second layer wiring, or in the insulating film positioned between the second layer wiring and the third layer wiring.

(Second Step)

A wiring material layer is formed on the insulating film including the via fill, followed by patterning the wiring material layer by means of a reactive ion etching with the resist pattern used as a mask so as to form a wiring having a smaller width in the contact portion with the via fill. Then, the resist pattern is removed by peeling by, for example, an ashing treatment.

The wiring material layer is formed of, for example, aluminum, an aluminum alloy, Ti, TiN, Mo, a Mo alloy, W or a W alloy.

(Third Step)

The surface of the insulating film including the wiring is treated with an aqueous solution for removing the etching residue containing a peroxosulfate, a fluorine-containing compound and an acid for adjusting the pH value and having a pH value of −1 to 3.

The function of each component of the aqueous solution for removing the etching residue is equal to that described previously in conjunction with the first embodiment of the present invention.

Incidentally, in the manufacture of an electronic device according to the third embodiment of the present invention described above, it is also possible to apply a rinsing treatment with a water-soluble organic solvent such as alcohol or with a pure water after the treatment with the aqueous solution for removing the etching residue.

As described above, according to the third embodiment of the present invention, a tungsten-based via fill is formed in an insulating film on a substrate, followed by forming a wiring material layer on the insulating film including the via fill. Then, the wiring material layer is patterned by a reactive ion etching with a resist pattern used as a mask so as to form a wiring having a smaller width in the contact portion with the via fill, followed by treating the surface of the insulating film including the wiring with an aqueous solution for removing the etching residue containing a peroxosulfate, a fluorine-containing compound and an acid for adjusting the pH value and having a pH value of −1 to 3. By the particular treatment, the residue including the metal attached to the surface and the side wall of the wiring during the RIE treatment and the polymer and the denatured layer derived from the resist can be removed without causing tungsten contained in the via fill exposed to the outside from the wiring to be dissolved. In other words, the polymer and the denatured layer derived from the resist can be removed by the oxidizing function performed by the peroxosulfate during the treatment with the aqueous solution for removing the etching residue.

Also, the metal residue attached to the surface and the side wall of the wiring can be removed by the function performed by the fluorine-containing compound, e.g., hydrofluoric acid, contained in the aqueous solution. In this case, it is possible to suppress the formation of $HF_2^-$ producing a strong etching force from the fluorine-containing compound, e.g., hydrofluoric acid, contained in the aqueous solution by adjusting the pH value of the aqueous solution to −1 to 3 by the function performed by the acid for adjusting the pH value so as to make appropriate the amount of $HF_2^-$. It follows that the metal forming the residue can be removed efficiently by HF exhibiting a weak etching force and the appropriate amount of $HF_2^-$ while suppressing the etching of the insulating film formed of, for example, an oxide.

During the treatment with the aqueous solution for removing the etching residue, tungsten (W) contained in the exposed via fill is also exposed to the aqueous solution. However, the aqueous solution for removing the etching residue produces the function of diminishing the difference in the ionization tendency (potential difference) between Al and tungsten, Ti or TiN as described previously. It follows that it is possible to overcome the inconvenience that tungsten in the exposed via fill is dissolved in the contact portion with the wiring, e.g., an Al-based wiring.

As described above, according to the third embodiment of the present invention, the treatment with an aqueous solution having the composition described previously is performed for removing the etching residue after formation of the wiring. As a result, it is possible to remove the metal attached to the surface and the side wall of the wiring during the RIE treatment and the residue such as a polymer and a denatured layer derived from the resist without causing tungsten contained in the via fill exposed to the outside from the wiring to be dissolved.

Particularly, it is possible to prevent tungsten contained in the via fill exposed to the outside from the wiring from being dissolved with a higher certainty and to remove the residue attached to the surface and the side wall of the wiring by the treatment with an aqueous solution for removing the etching residue containing 0.01 mol/L to 20 mols/L of ammonium peroxodisulfate, $5 \times 10^{-6}$ mol/L to $5 \times 10^{-1}$ mol/L of a fluorine-containing compound and an acid for adjusting the pH value and having a pH value of –1 to 3.

As a result, it is possible to manufacture an electronic device, in which the wiring is connected satisfactorily to the via fill so as to improve the reliability.

It is also possible to apply a rinsing treatment with a water-soluble organic solvent such as alcohol or with a pure water after the treatment with the aqueous solution for removing the etching residue so as to prevent an increase in the difference in the ionization tendency in the diluting process of the aqueous solution. It follows that it is possible to wash away the aqueous solution for removing the etching residue from the surface of the insulating film without causing tungsten contained in the via fill exposed to the outside from the wiring to be dissolved.

EXAMPLES

Some Examples of the present invention will now be described in detail with reference to the accompanying drawings.

Example 1

Figure 1B:
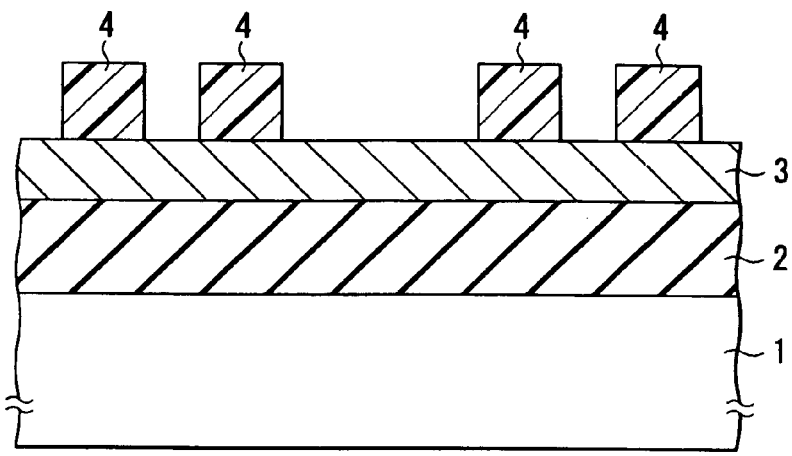
Figure 1C:
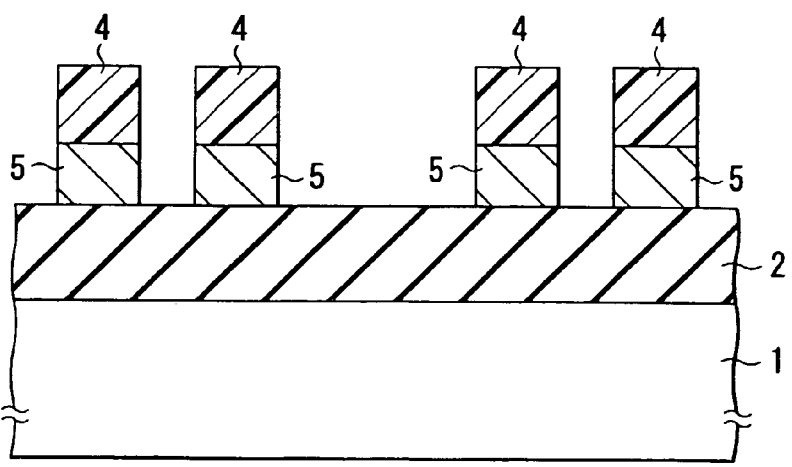

In the first step, an insulating film 2 consisting of, for example, $SiO_2$ was formed by a CVD method on a silicon substrate 1 having diffusion layers (not shown) such as a source region and a drain region formed therein, followed by forming a wiring material layer 3 made of an Al—Cu alloy on the insulating film 2, as shown in FIG. 1A. Then, a resist film was formed on the wiring material layer 3, followed by subjecting the resist film to a so-called "photographic etching", in which the resist film was exposed to light and subjected to a developing treatment, so as to form a resist pattern 4, as shown in FIG. 1B. Further, the exposed portion of the wiring material layer 3 was selectively removed by a reactive ion etching (RIE) using, for example, a fluorine-based reactant gas with the resist pattern 4 used as a mask so as to form a wiring 5 made of an Al—Si alloy, as shown in FIG. 1C.

Figure 2:
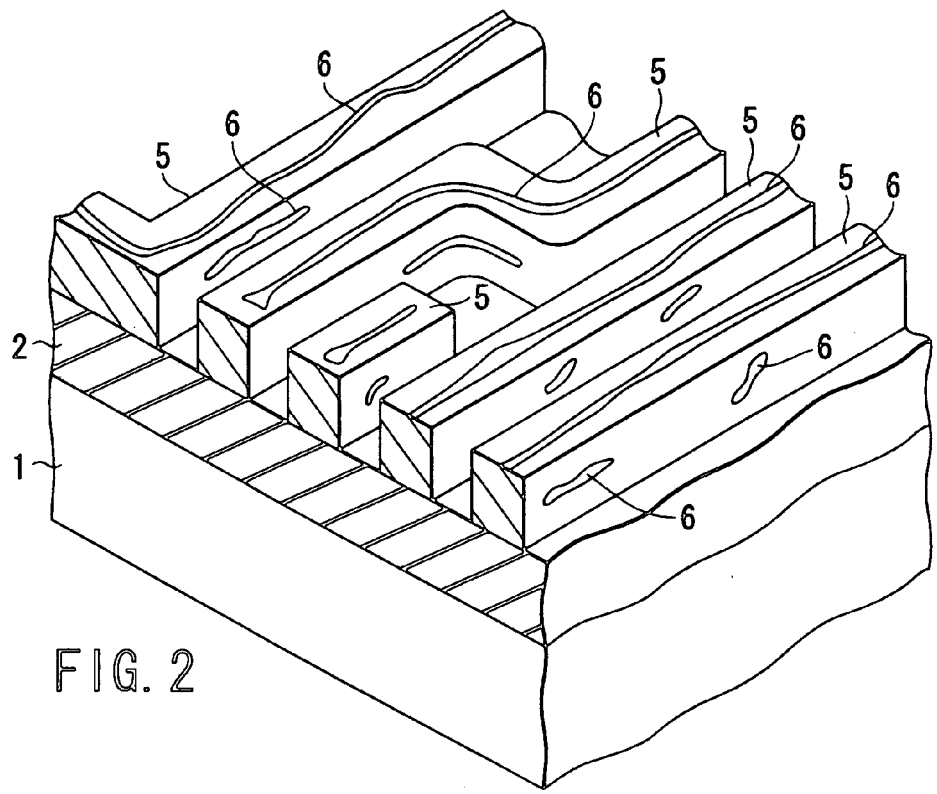
FIG. 2 is an oblique view showing an Al—Cu alloy wiring after removal by peeling of a resist pattern in the manufacturing process of a semiconductor device in Example 1 of the present invention.
Figure 3:
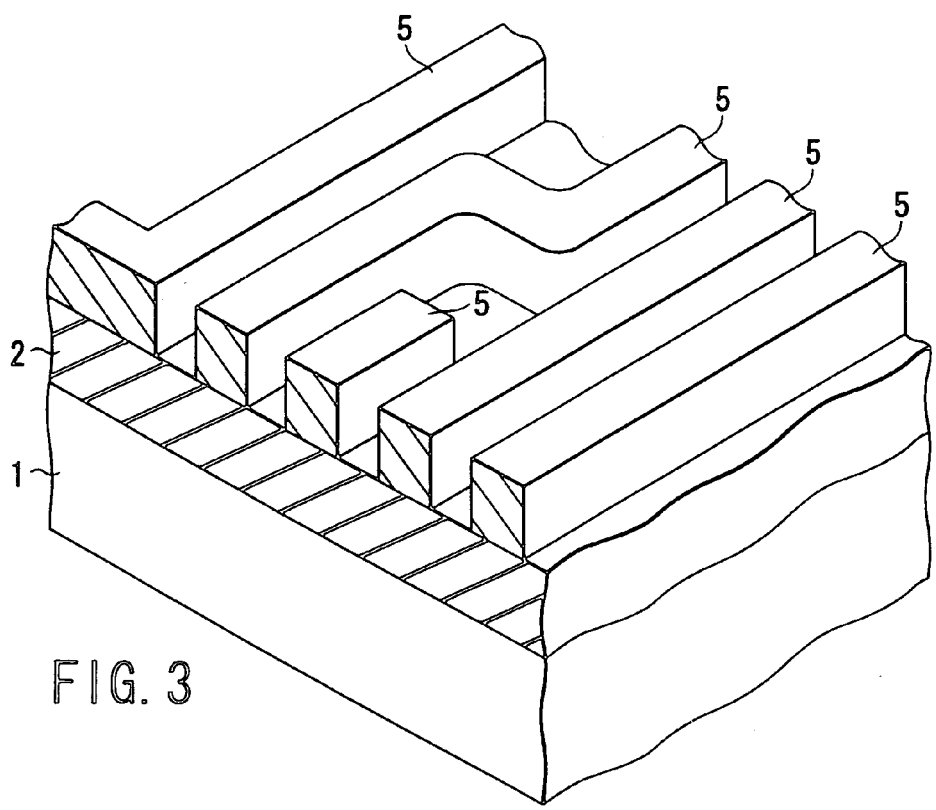
FIG. 3 is an oblique view showing an Al—Cu alloy wiring after removal by peeling of a resist pattern and the subsequent step of treatment with an aqueous solution for removing the etching residue in the manufacturing process of a semiconductor device in Example 1 of the present invention.

In the next step, the resist pattern 4 was removed. In this step, a residue 6 including a polymer and a denatured layer derived from the metal and the resist was attached to the surface and the side wall of the wiring 5, as shown in FIG. 2. Then, the insulating film 2 including the wiring 5 was treated with an aqueous solution for removing the etching residue containing 0.2 mol/L of ammonium peroxodisulfate, $5 \times 10^{-4}$ mol/L of hydrofluoric acid and sulfuric acid for adjusting the pH value and having a pH value of 0.20. By the treatment with the aqueous solution for removing the etching residue, the residue 6 on the surface and the side wall of the wiring 5 was removed as shown in FIG. 3. The wiring 5 was found to be quite free from the perforation and the thinning caused by the etching.

Also, a rinsing treatment with a pure water was applied after the treatment with the aqueous solution for removing the etching residue. In this case, it was possible to wash away the aqueous solution for removing the etching residue from the surface of the insulating film 2 without bringing about the etching of the wiring 5 made of an Al—Cu alloy.

Further, a semiconductor device was manufactured by the ordinary method.

Comparative Example 1

An insulating film including a wiring was treated as in Example 1, except that an aqueous solution containing 10% by weight of hydroxylamine was used in place of the aqueous solution for removing the etching residue used in Example 1. It was found possible to remove the residue on the surface and the side wall of the wiring. However, the wiring made of the Al—Cu alloy was etched with the aqueous solution of hydroxylamine so as to be thinned.

Also, a rinsing treatment with a pure was applied after the treatment with the aqueous solution of hydroxylamine for washing away the aqueous solution of hydroxylamine. In this case, the etching of the wiring made of the Al—Cu alloy proceeded further rapidly.

Example 2

Figure 4A:
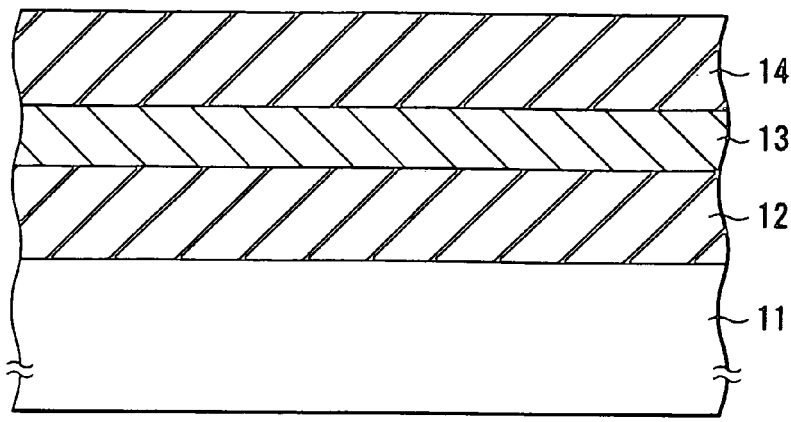
FIGS. 4A to 4F are cross sectional views collectively showing a process of manufacturing a semiconductor device in Example 2 of the present invention.

In the first step, a first layer insulating film 12 made of, for example, $SiO_2$ was formed by a CVD method on a silicon substrate 11 having diffusion layers (not shown) such as a source region and a drain region formed therein, followed by forming a wiring material layer made of an Al—Cu alloy on the first layer insulating film 12, as shown in FIG. 4A. Then, a resist film was formed on the wiring material layer, followed by subjecting the resist film to a photographic etching so as to form a resist pattern. Further, the exposed portion of the wiring material layer was selectively removed by etching with the resist pattern used as a mask so as to form a first layer wiring 13. After formation of the first layer wiring 13, the resist pattern was removed by peeling, followed by forming a second layer insulating film 14 made of $SiO_2$ by a CVD method on the first layer insulating film 12 including the first layer wiring 13.

Figure 4B:
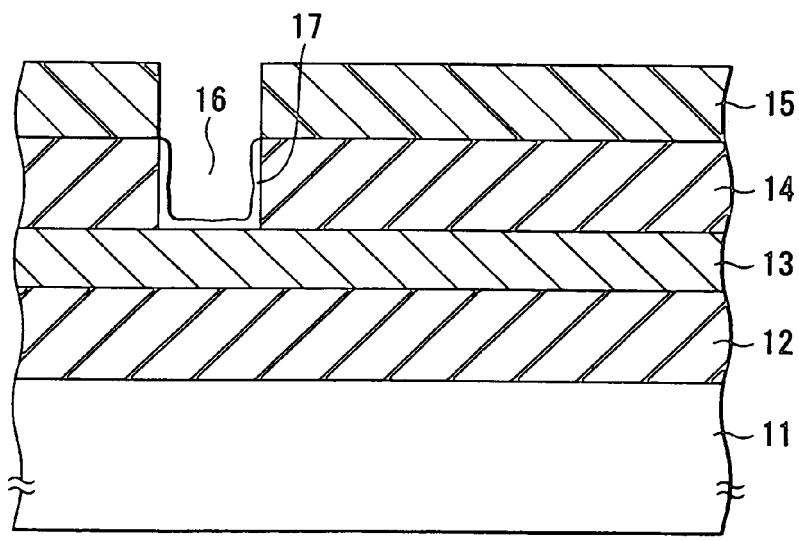
Figure 4C:
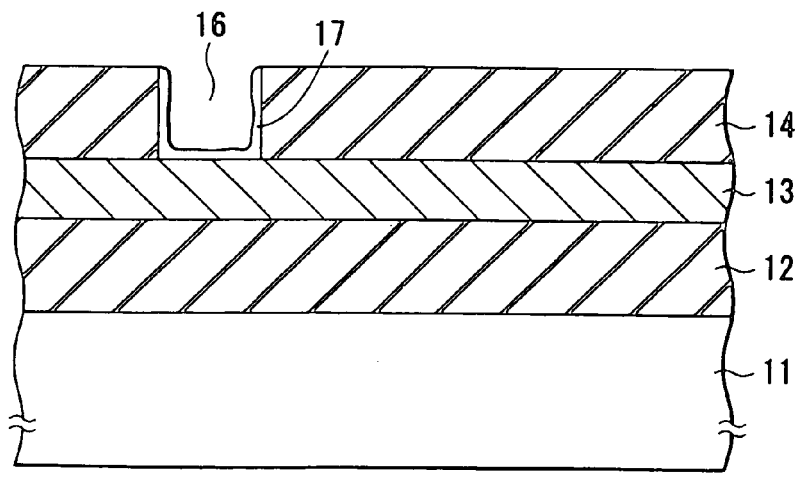

In the next step, a resist film was formed to cover the second layer insulating film 14, followed by subjecting the resist film to a photographic etching so as to form a resist pattern 15 having openings formed in the portions where via holes were to be formed, as shown in FIG. 4B. Then, the exposed portion of the second layer insulating film 14 was selectively removed by a RIE treatment using, for example, a fluorine-based reactant gas with the resist pattern 15 used as a mask so as to form a via hole 16, followed by removing the resist pattern 15. The via hole 16 extended to reach the surface of the first layer wiring 13. In this step, a residue 17 including a polymer derived from the resist and a denatured layer derived from the resist and the material of the insulating film was attached to the inner surface of the via hole 16, as shown in FIG. 4C.

Figure 4D:
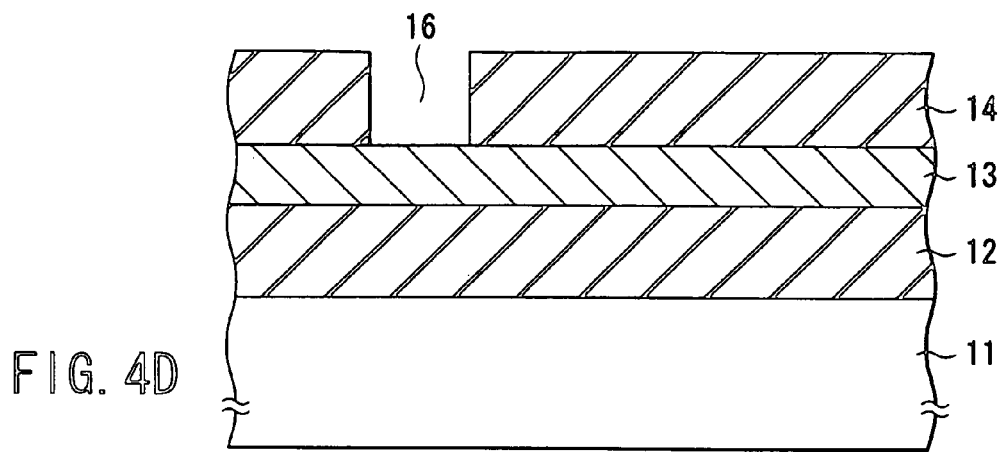

In the next step, the second layer insulating film 14 including the via hole 16 was treated with an aqueous solution for removing the etching residue containing 0.2 mol/L of ammonium peroxodisulfate, $5 \times 10^{-4}$ mol/L of hydrofluoric acid, and sulfuric acid for adjusting the pH value and having a pH value of 0.20. The residue 17 attached to the inner surface of the via hole 16 was removed by the treatment with the aqueous solution for removing the etching residue, as shown in FIG. 4D. Also, the first layer wiring 13 exposed to the outside through the via hole 16 and made of an Al—Cu alloy was found to be quite free from reduction in the thickness caused by the etching. Then, a rinsing treatment with a pure water was applied. It was possible to wash away the aqueous solution for removing the etching residue from the surface of the second layer insulating film 14 without causing the first layer wiring 13 made of an Al—Cu alloy to be etched.

Figure 4E:
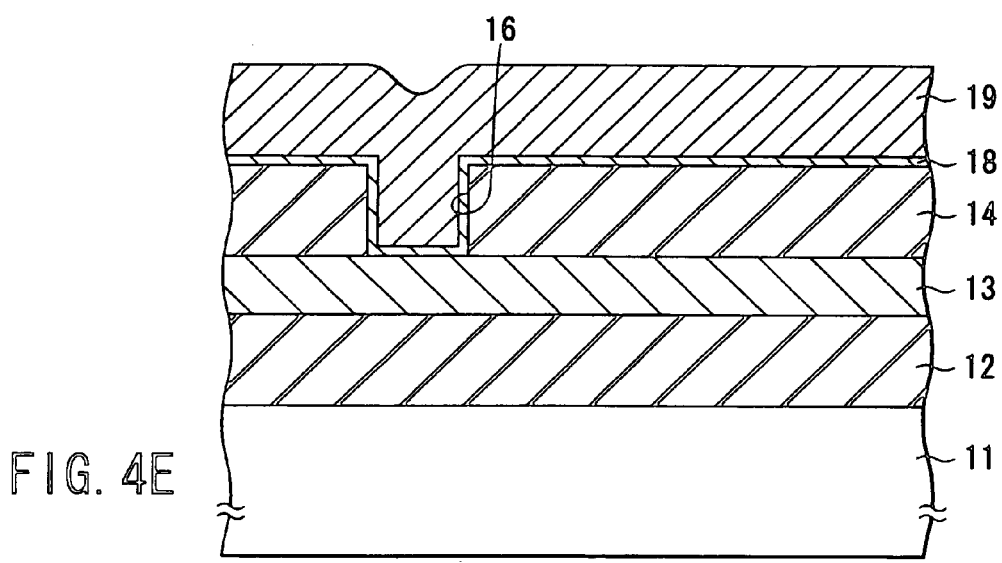
Figure 4F:
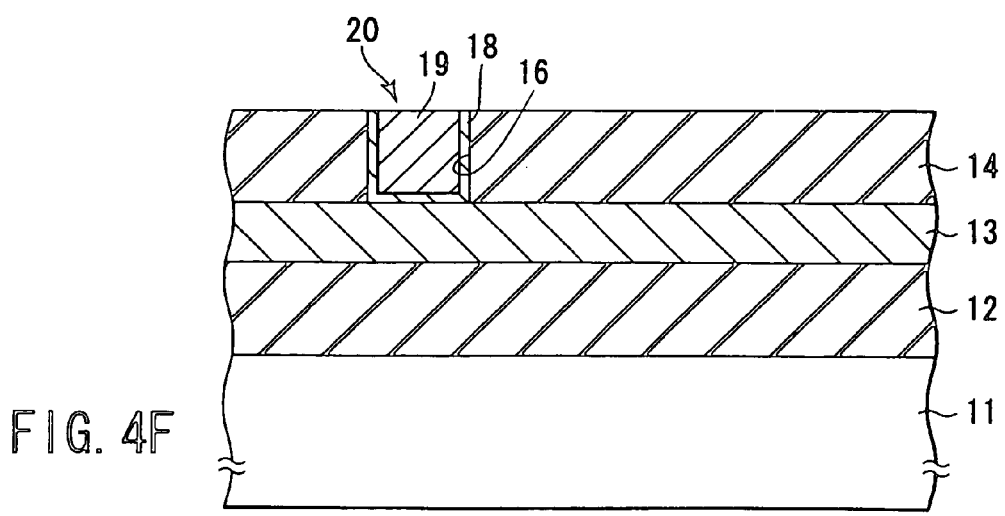

In the next step, a Ti film, which was used as a conductive barrier film, and a tungsten film were deposited on the second layer insulating film 14 including the via hole 16 so as to form a Ti film 18 on the inner surface of the via hole 16 and to bury a tungsten film 19 in the via hole 16 having the Ti film 18 formed on the inner surface, as shown in FIG. 4E. Then, a chemical mechanical polishing (CMP) treatment was applied to the tungsten film 19 and the Ti film 18 so as to form a via fill 20 connected to the first layer wiring 13 in the second layer insulating film 14, as shown in FIG. 4F.

The via fill 20 thus formed was free from a partial peeling of the Ti film 18 and was found to have been connected to the first layer wiring 13 with a low resistance.

Further, a semiconductor device was manufactured by an ordinary method.

Comparative Example 2

The second layer insulating film including a via hole was treated as in Example 2, except that an aqueous solution containing 10% by weight of hydroxylamine was used in place of the aqueous solution for removing the etching residue used in Example 2. As a result, a residue attached to the inner surface of the via hole was removed. However, the first layer wiring exposed to the outside through the via hole and made of an Al—Cu alloy was etched with the aqueous solution of hydroxylamine and, thus, the thickness of the first layer wiring was decreased. Also, a rinsing treatment with a pure was applied after the treatment with the aqueous solution of hydroxylamine for washing away the aqueous solution of hydroxylamine. In this case, the etching of the first layer wiring made of the Al—Cu alloy proceeded further rapidly.

Example 3

Figure 5A:
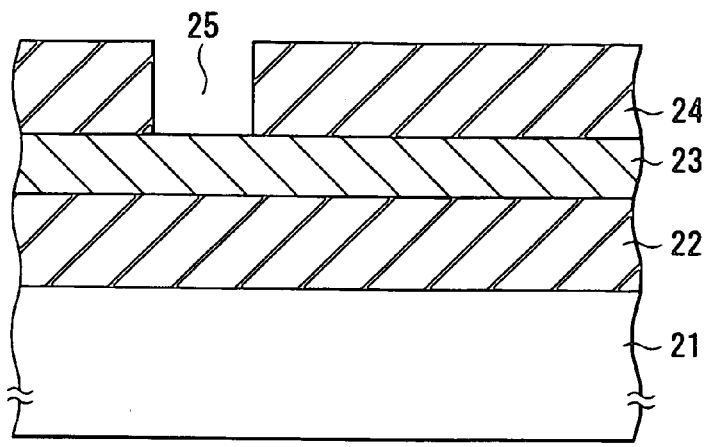
FIGS. 5A to 5F are cross sectional views collectively showing a process of manufacturing a semiconductor device in Example 3 of the present invention.

In the first step, a first layer insulating film 22 made of, for example, $SiO_2$ was formed by a CVD method on a silicon substrate 21 having diffusion layers (not shown) such as a source region and a drain region formed therein, followed by forming a wiring material layer made of, for example, an Al—Cu alloy on the first layer insulating film 22, as shown in FIG. 5A. Then, a resist film was formed to cover the wiring material layer, followed by subjecting the resist film to a photographic etching so as to form a resist pattern. Further, a first layer wiring 23 was formed on the first layer insulating film 22 by selectively etching the exposed portion of the wiring material layer with the resist pattern used as a After removal of the resist pattern by peeling, a second layer insulating film 24 made of $SiO_2$ was formed by a CVD method on the first layer insulating film 22 including the first layer wiring 23. Further, a resist film was formed to cover the second layer insulating film 24, followed by subjecting the resist film to a photographic etching so as to form a resist pattern having openings formed in the portions where via holes were to be formed. Still further, the exposed portion of the second layer insulating film 24 was selectively removed by a RIE method using a fluorine-based reactant gas with the resist pattern used as a mask so as to form a via hole 25. The via hole 25 extended to reach the surface of the first layer wiring 23.

Figure 5B:
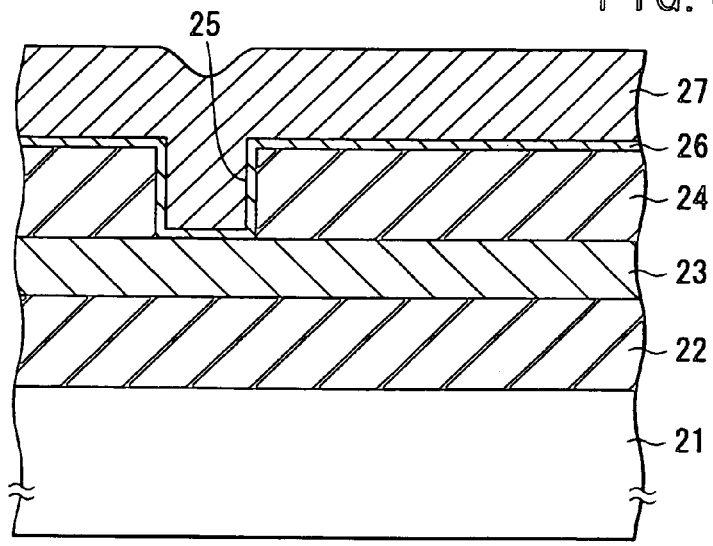
Figure 5C:
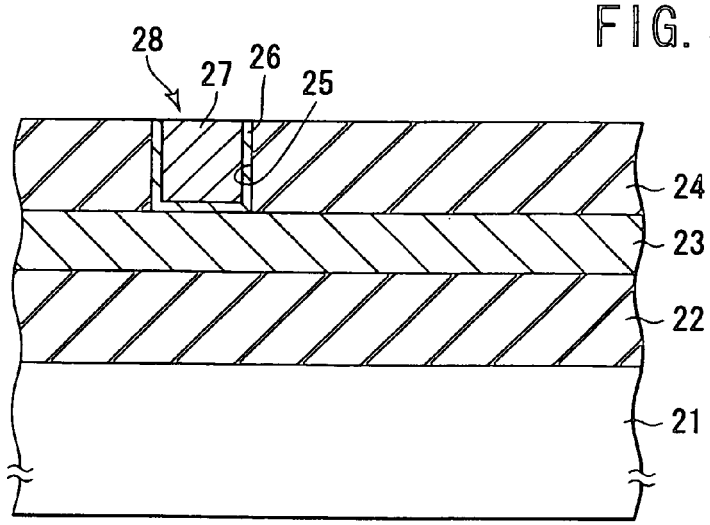

In the next step, a Ti film acting as a conductive barrier film and a tungsten film were deposited on the second layer insulating film 24 including the via hole 25 so as to form a Ti film 26 on the inner surface of the via hole 25 and to bury a tungsten film 27 in the via hole 25 having the Ti film 26 formed on the inner surface thereof, as shown in FIG. 5B. Then, a chemical mechanical polishing (CMP) treatment was applied to the tungsten film 27 and the Ti film 26 so as to form a via fill 28 connected to the first layer wiring 23 in the second layer insulating film 24, as shown in FIG. 5C.

Figure 6:
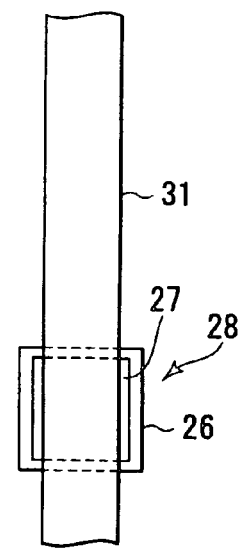
FIG. 6 is a plan view showing in a magnified fashion the via fill on the surface of the second layer insulating film and the second wiring layer shown in FIG. 5F.
Figure 5D:
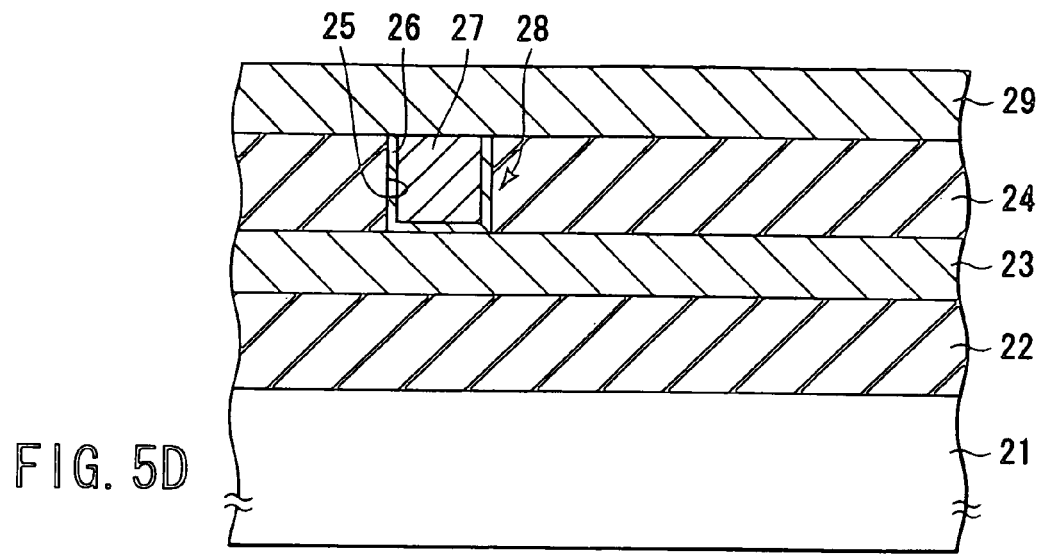
Figure 5E:
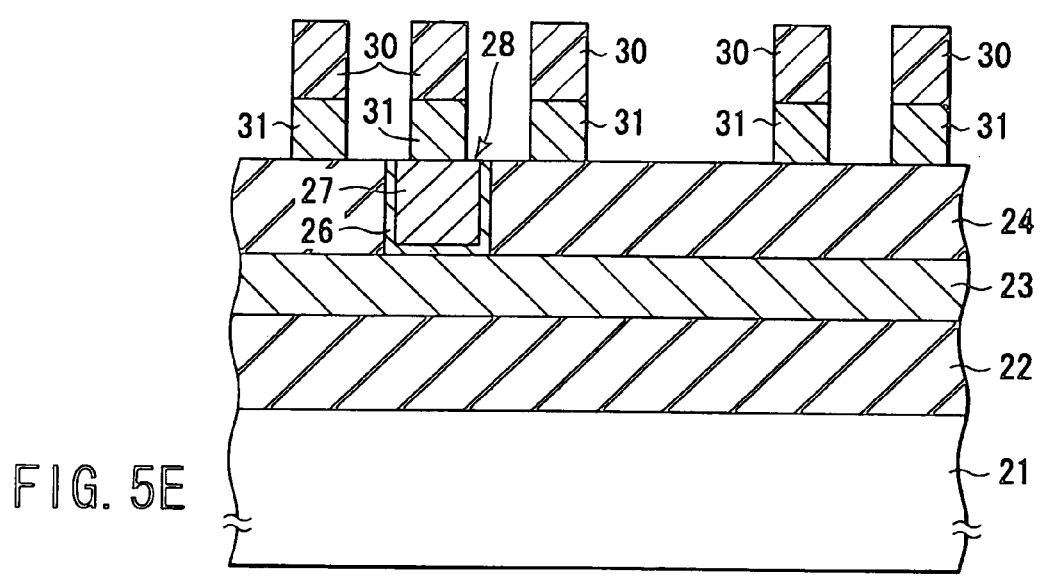
Figure 5F:
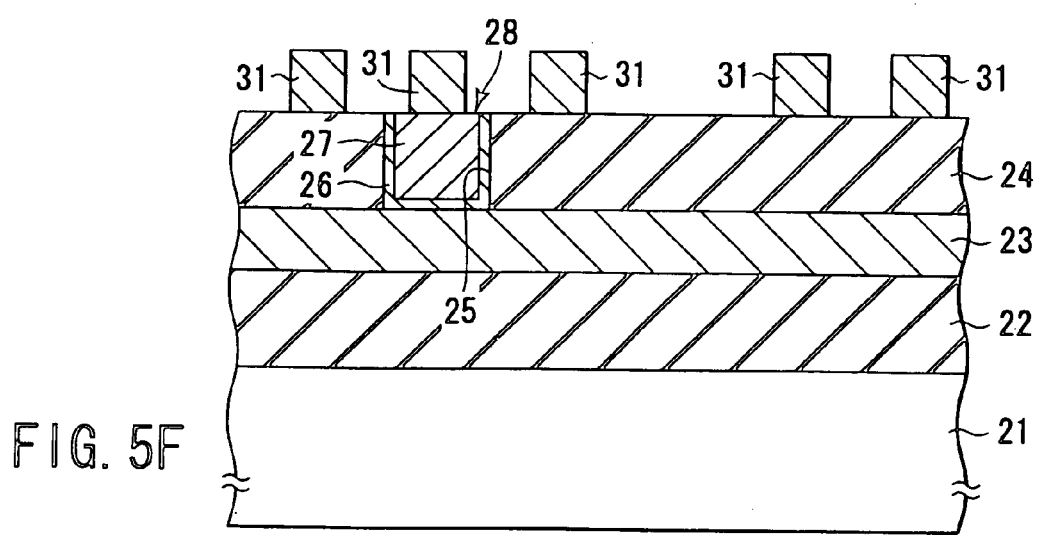

Further, a wiring material layer 29 made of, for example, an Al—Cu alloy was formed on the second layer insulating film 24 including the via fill 28, as shown in FIG. 5D, followed by depositing a resist film on the wiring material layer 29 and subsequently subjecting the resist film to a photographic etching so as to form a resist pattern 30, as shown in FIG. 5E. Then, the exposed portion of the wiring material layer 29 was selectively removed by a RIE treatment using, for example, a fluorine-based reactant gas with the resist pattern 30 used as a mask, followed by removing by peeling the resist pattern 30 so as to form a second layer wiring 31 having a width smaller than that of the via fill 28 in the contact portion with the via fill 28, as shown inn FIGS. 5F and 6. In other words, the via fill 28 was exposed to the outside from both sides of the second layer wiring 31 in the contact portion with the second layer wiring 31. In this step, a residue (not shown) including a polymer and a denatured layer derived from the metal and the resist was attached to the surface and the side wall of the second layer wiring 31.

In the next step, the second layer insulating film 24 including the second layer wiring 31 was treated with an aqueous solution for removing the etching residue containing 0.2 mol/L of ammonium peroxodisulfate, $5\times10^{-4}$ mol/L of hydrofluoric acid, and sulfuric acid for adjusting the pH value and having a pH value of 0.20. Incidentally, the aqueous solution for removing the etching residue exhibited an Al—W potential difference of 0.2V relating to the ionization tendency and an Al—Ti potential difference of 0.35V.

The residue on the surface and the side wall of the second layer wiring 31 was removed by the treatment with the aqueous solution for removing the etching residue. Also, tungsten contained in the via fill 28 exposed to the outside from both sides of the second layer wiring 31 was not dissolved at all in spite of the contact with the aqueous solution for removing the etching residue. Further, the second layer wiring 31 made of an Al—Cu alloy was quite free from perforation and thinning in spite of the contact with the aqueous solution for removing the etching residue.

Further, a rinsing treatment with a pure water was applied after the treatment with the aqueous solution for removing the etching residue. It was possible to wash away the aqueous solution for removing the etching residue from the surface of the second layer insulating film 24 without causing tungsten contained in the via fill 28 exposed to the outside to be dissolved in the rinsing water.

Then, a semiconductor device was manufactured by an ordinary method.

Comparative Example 3

The second layer insulating film including the second layer wiring and the exposed via fill was treated as in Example 3, except that an aqueous solution containing 10% by weight of hydroxylamine was used in place of the aqueous solution for removing the etching solution used in Example 3. As a result, it was possible to remove the residue from the surface and the side wall of the second layer wiring. However, tungsten contained in the via fill exposed to the outside from both sides of the second layer wiring was dissolved as a result of contact with the aqueous solution of hydroxylamine, and second layer wiring made of an Al—Cu alloy was also etched so as to be thinned.

Also, a rinsing treatment with a pure water was applied after the treatment with the aqueous solution of hydroxylamine so as to wash away the aqueous solution of hydroxylamine. As a result, the dissolution of tungsten contained in the exposed via fill and the etching of the second layer wiring made of an Al—Cu alloy further proceeded rapidly.

Example 4

Figure 7A:
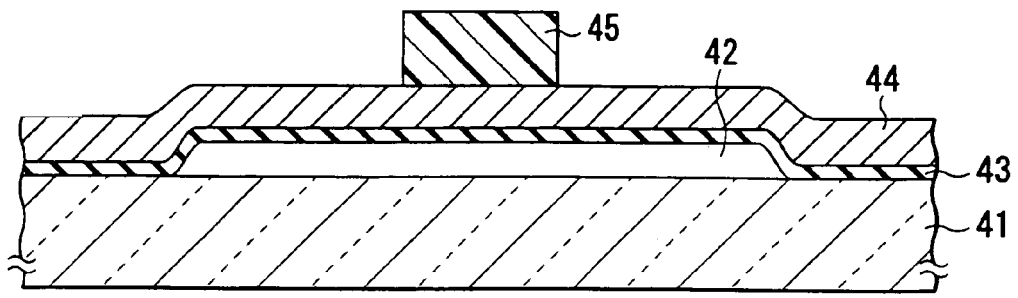
FIGS. 7A to 7H are cross sectional views collectively showing a process of manufacturing a liquid crystal display device in Example 4 of the present invention.

In the first step, an amorphous silicon (a-Si) thin film having a thickness of 50 nm was deposited on a glass substrate 41 by a reduced pressure CVD method with the substrate temperature set at 420° C., as shown in FIG. 7A, followed by doping the a-Si film with an impurity, e.g., boron, in order to control the threshold value of a TFT. Then, an excimer laser annealing was applied to the a-Si film doped with boron so as to crystallize the a-Si film, thereby forming a polycrystalline silicon (poly-Si) thin film doped with boron. Incidentally, it is possible to employ a lamp annealing in place of the excimer laser annealing referred to above. Further, a resist film was formed to cover the surface of the poly-Si thin film, followed by applying a photographic etching to the resist film so as to form a resist pattern (not shown). In the next step, the poly-Si thin film was selectively removed by a CDE (Chemical Dry Etching) method using a $CF_4$ gas and an $O_2$ gas with the resist pattern used as a mask so as to form an island-shaped poly-Si thin film 42. After the resist pattern was removed by an ashing treatment, a $SiO_2$ thin film 43 having a thickness of 200 nm and used as a gate insulating film was deposited on the glass substrate 41 including the island-shaped poly-Si thin film 22 by a reduced pressure plasma CVD method using TEOS as a raw material gas, followed by forming a MoW film 44 on the $SiO_2$ thin film 43. Further, a resist film was formed to cover the MoW film 44, followed by applying a photographic etching to the resist film so as to form a resist pattern 45, as shown in FIG. 7A.

Figure 7B:
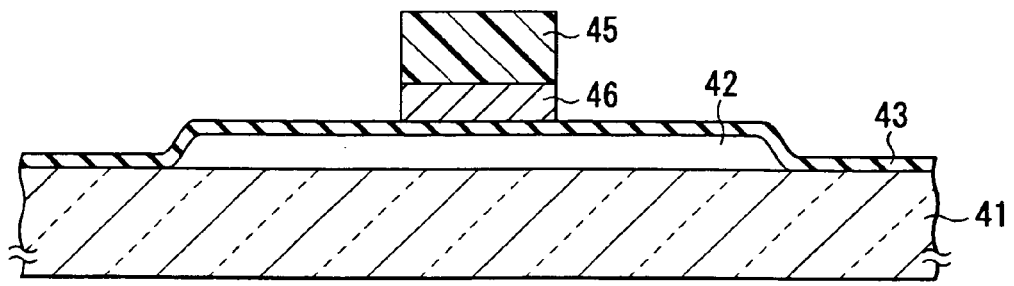

In the next step, the MoW film 44 was selectively removed by a RIE method using, for example, an oxygen gas and a fluorine-base reactant gas with the resist pattern 45 used as a mask so as to form a gate electrode 46, as shown in FIG. 7B.

Figure 7C:
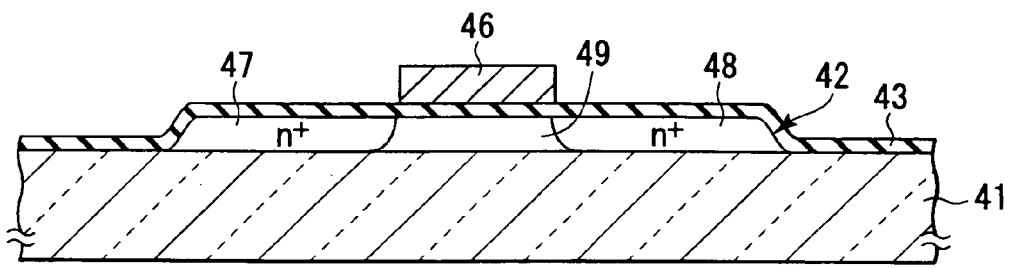

After formation of the gate electrode 46, the resist pattern 45 was removed by peeling. In this step, a residue (not shown) including a polymer and a denatured layer derived from the resist was attached to the surface and the side wall of the gate electrode 46. Then, the $SiO_2$ thin film 43 including the gate electrode 46 was treated with an aqueous solution for removing the etching residue containing 0.2 mol/L of ammonium peroxodisulfate, $5\times10^{-4}$ mol/L of hydrofluoric acid, and sulfuric acid for adjusting the pH value and having a pH value of 0.20. The residue on the surface and the side wall of the gate electrode 46 was removed by the treatment with the aqueous solution for removing the etching residue as shown in FIG. 7C. Also, a rinsing treatment with a pure water was applied after the treatment with the aqueous solution for removing the etching residue so as to wash away the aqueous solution for removing the etching residue from the surface of the $SiO_2$ thin film 43 without causing the gate electrode 46 consisting of MoW to be dissolved. Then, the island-shaped poly-Si thin film 42 was selectively doped with an impurity, e.g., phosphorus, with the gate electrode 46 used as a mask so as to form $n^+$-type source and drain regions 47, 48 and a p-type channel region 49 in the island-shaped poly-Si thin film 42.

Figure 7D:
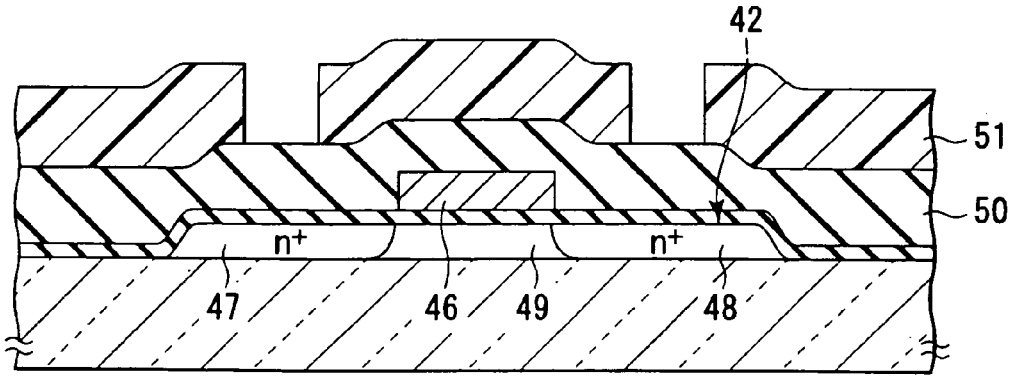
Figure 7E:
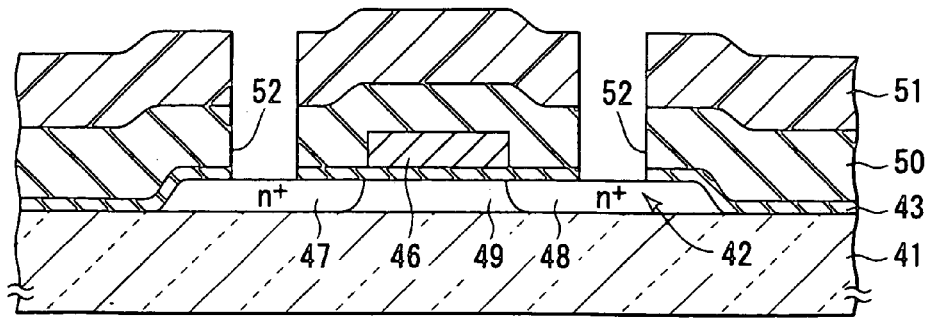

In the next step, a $SiO_2$ film 50 acting as an interlayer insulating film was deposited on the entire surface by a reduced pressure CVD method, as shown in FIG. 7D, followed by forming a resist film covering the $SiO_2$ film 50 and subsequently applying a photographic etching to the resist film so as to form a resist pattern 51 having openings formed in the portions where contact holes were to be formed. Then, the $SiO_2$ film 50 and the $SiO_2$ thin film 43 were selectively etched by a RIE treatment using, for example, a fluorine-based reactant gas with the resist pattern 51 used as a mask so as to form contact holes 52 extending to reach the source and drain regions 47, 48, respectively.

Figure 7F:
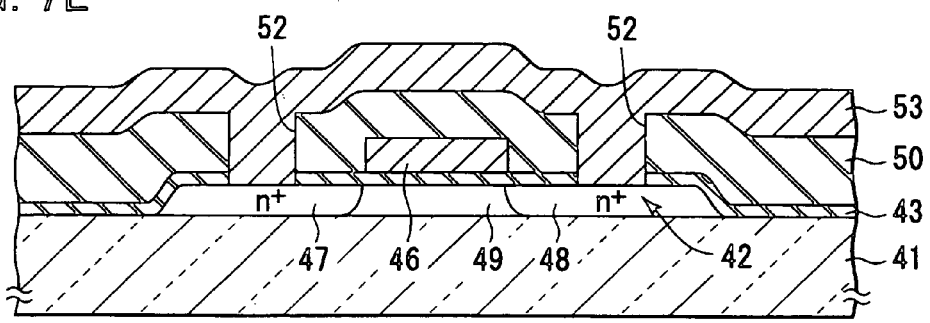

After formation of the contact holes 52, the resist pattern 51 was removed by peeling. In this step, a residue (not shown) including a polymer and a denatured layer derived from the resist was attached to the inner wall of the contact hole 52. Then, the $SiO_2$ film 50 including the contact hole 52 was treated with an aqueous solution for removing the etching residue containing 0.2 mol/L of ammonium peroxodisulfate, $5\times10^{-4}$ mol/L of hydrofluoric acid, and sulfuric acid for adjusting the pH value and having a pH value of 0.20. The residue on the inner wall of the contact hole 52 was removed by the treatment with the aqueous solution for removing the etching residue. Then, an Al film 53 was formed by a vapor deposition on the surface of the $SiO_2$ 50 including the contact holes 52, as shown in FIG. 7F.

Figure 7G:
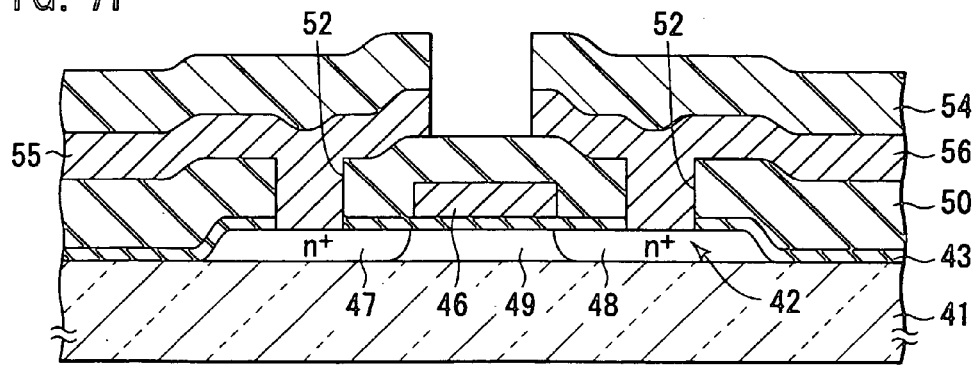

In the next step, a resist film was formed to cover the Al film 53, followed by applying a photographic etching to the resist film so as to form a resist pattern 54. Then, the Al film 53 was selectively removed by a RIE treatment using, for example, a chlorine-based reactant gas with the resist pattern 54 used as a mask so as to form source and drain electrodes 55, 56 connected to the source and drain regions 47, 48, respectively, through the contact holes 52, as shown in FIG. 7G.

Figure 7H:
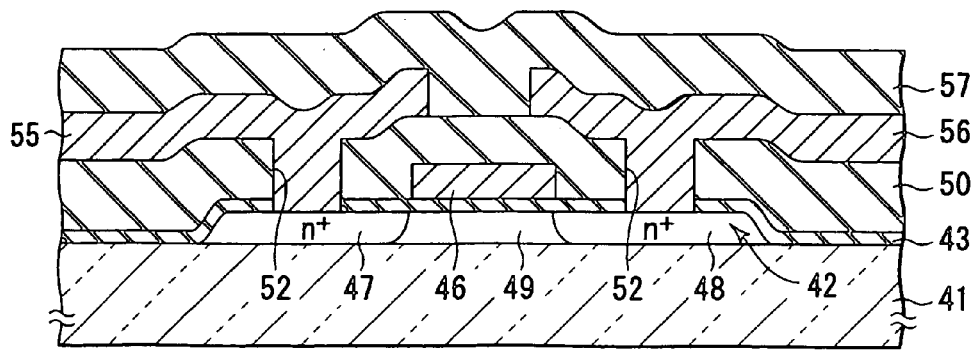

After formation of the source and drain electrodes 55, 56, the resist pattern 54 was removed by peeling. In this step, a residue (not shown) including a polymer and a denatured layer derived from the metal and the resist was attached to the surfaces and the side walls of the source and drain electrodes 55, 56. Then, the $SiO_2$ film 50 including the source and drain electrodes 55, 56 was treated with an aqueous solution for removing the etching residue containing 0.2 mol/L of ammonium peroxodisulfate, $5\times10^{-4}$ mol/L of hydrofluoric acid, and sulfuric acid for adjusting the pH value and having a pH value of 0.20. The residue on the surfaces and the side walls of the source and drain electrodes 55, 56 was removed by the treatment with the aqueous solution for removing the etching residue. Also, a rinsing treatment with a pure water was applied after the treatment with the aqueous solution for removing the etching residue. It was possible to wash away the aqueous solution for removing the etching residue from the surface of the $SiO_2$ film 50 without causing the source and drain electrodes 55, 56 each made of Al to be dissolved. Then, a passivation film 57 such as a silicon nitride film was formed on the $SiO_2$ film 50 including the source and drain electrodes 55, 56, as shown in FIG. 7H.

After formation of the passivation film 57, a liquid crystal display device including a thin film transistor was manufactured by an ordinary method.

According to Example 4, the gate electrode 46 consisting of MoW and source and drain electrodes 55, 56 each consisting of aluminum are formed by a reactive ion etching (RIE), followed by removing a metal residue as well as a polymer and a denatured layer derived from the resist, which are attached to the surfaces and the side walls of the gate electrode 46 and the source and drain electrodes 55, 56, without bringing about the thinning by etching of the gate electrode 46 and the source and drain electrodes 55, 56 so as to make it possible to manufacture a liquid crystal display device having a high reliability.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an electronic device, comprising:
   forming a tungsten-based via fill in an insulating film on a substrate;
   forming a wiring material layer on the insulating film including the via fill;
   patterning the wiring material layer by a reactive ion etching with a resist pattern used as a mask so as to form a wiring having a smaller width in the contact portion with the via fill; and
   treating the surface of the insulating film including the wiring with an aqueous solution for removing the etching residue, the aqueous solution comprising a peroxosulfate, a fluorine-containing compound and an acid for adjusting the pH value and having a pH value of −1 to 3.

2. The method of manufacturing an electronic device according to claim 1, wherein the peroxosulfate is provided by ammonium peroxodisulfate and is contained in the aqueous solution for removing the etching residue in an amount of 0.01 mol/L to 20 mol/L.

3. The method of manufacturing an electronic device according to claim 1, wherein the fluorine-containing compound is selected from the group consisting of hydrofluoric acid and ammonium acid fluoride.

4. The method of manufacturing an electronic device according to claim 1, wherein the fluorine-containing compound is contained in the aqueous solution for removing the etching residue in an amount of $5 \times 10^{-6}$ mol/L to $5 \times 10^{-1}$ mol/L.

5. The method of manufacturing an electronic device according to claim 1, wherein the acid for adjusting the pH value is sulfuric acid.

6. The method of manufacturing an electronic device according to claim 1, wherein a method further comprises a rinsing treatment with a water-soluble organic solvent or a pure water s performed after the treatment with the aqueous solution for removing the etching residue.

* * * * *